(12) United States Patent
Meng et al.

(10) Patent No.: US 7,987,898 B2
(45) Date of Patent: Aug. 2, 2011

(54) HEAT DISSIPATION DEVICE

(75) Inventors: Jin-Gong Meng, Shenzhen (CN); Ching-Bai Hwang, Taipei Hsien (TW)

(73) Assignees: Fu Zhun Precision Industry (Shen Zhen) Co., Ltd., Shenzhen, Guangdong Province (CN); Foxconn Technology, Co., Ltd., Tu-Cheng, New Taipei (TW)

( * ) Notice: Subject to any disclaimer, the term of this patent is extended or adjusted under 35 U.S.C. 154(b) by 965 days.

(21) Appl. No.: 11/833,951

(22) Filed: Aug. 3, 2007

(65) Prior Publication Data

US 2009/0008066 A1 Jan. 8, 2009

(30) Foreign Application Priority Data

Jul. 4, 2007 (CN) .......................... 2007 1 0076390

(51) Int. Cl.
*F28F 7/00* (2006.01)
*H05K 7/20* (2006.01)

(52) U.S. Cl. ................................. 165/80.3; 165/104.34

(58) Field of Classification Search ................. 165/80.3, 165/185, 104.33, 104.34, 121, 104.21; 361/695, 361/697, 679.52, 703
See application file for complete search history.

(56) References Cited

U.S. PATENT DOCUMENTS

| | | | | |
|---|---|---|---|---|
| 5,847,927 A | * | 12/1998 | Minning et al. | 361/696 |
| 5,854,739 A | * | 12/1998 | Steiner et al. | 361/703 |
| 5,884,691 A | * | 3/1999 | Batchelder | 165/80.3 |
| 6,411,508 B1 | * | 6/2002 | Kang et al. | 361/695 |
| 6,688,379 B2 | * | 2/2004 | Huang et al. | 165/121 |
| 6,958,912 B2 | * | 10/2005 | Pokharna et al. | 361/700 |
| 7,492,588 B2 | * | 2/2009 | Hwang et al. | 361/694 |
| 2002/0108743 A1 | * | 8/2002 | Wirtz | 165/185 |
| 2003/0161102 A1 | * | 8/2003 | Lee et al. | 361/687 |
| 2006/0137862 A1 | | 6/2006 | Huang et al. | |
| 2007/0044941 A1 | * | 3/2007 | Kuo | 165/80.3 |

FOREIGN PATENT DOCUMENTS

| | | |
|---|---|---|
| TW | 468823 | 12/2001 |
| TW | 498995 | 8/2002 |
| TW | M302868 | 12/2006 |
| TW | 200708231 | 2/2007 |

* cited by examiner

*Primary Examiner* — Tho V Duong
(74) *Attorney, Agent, or Firm* — Jeffrey T. Knapp

(57) ABSTRACT

A heat dissipation device includes a cooling fan (15) defining an air inlet and an air outlet (157) oriented perpendicular to the air inlet; a metal foam (11) is arranged in the air outlet of the cooling fan, and a heat pipe (13) has a condensing end (131) being thermally attached to the metal foam. The metal foam forms numerous open cells (118). A plurality of guiding holes (116) are defined in the metal foam facing to a rotor (153) of the cooling fan for an airflow generated by the cooling fan to flow therethrough. The guiding hole (116) has a size larger that that of the open cell (118). The guiding hole has an outer end opened to an outside of the cooling fan (15).

12 Claims, 7 Drawing Sheets

HEAT DISSIPATION DEVICE

BACKGROUND OF THE INVENTION

1. Field of the Invention

The present invention relates generally to a heat dissipation device, and particularly to a heat dissipation device for a heat generating electronic device.

2. Description of Related Art

With the continuing development of the electronic technology, electronic packages such as CPUs (central processing units) are generating more and more heat that requires immediate dissipation. Thus a heat dissipation device is often needed to efficiently remove the heat generated by the CPU.

A conventional heat dissipation device generally includes a cooling fan combination with a heat sink. The heat sink includes a plurality of stacked fins. The fins are planar and parallel to each other. A flow channel is formed between two adjacent fins. During operation of the heat dissipation device, the heat sink absorbs the heat generated by the CPU for dissipation. An airflow generated by the cooling fan flows through the flow channels to exchange heat with the fins. Then the heat is dissipated to surrounding environment by the airflow. Thus, heat dissipation of the electronic package is accomplished.

For enhancing the heat dissipation effectiveness of this heat dissipation device, a heat dissipation area of the fin unit needs to be increased. One way to increase the heat dissipation area of the fin unit is to reduce the spacing distance of the adjacent fins so that the fin unit can accommodate more fins. However, this way will increase the weight of the heat dissipation device, which is disadvantageous in view of lightweight requirement of electronic products. Another way is to increase the size of each fin. This way will increase both the weight and size of the heat dissipation device, which is disadvantageous in view of compact requirement of the electronic products.

What is needed, therefore, is a heat dissipation device having a high heat dissipation effectiveness by increasing heat dissipation area of a heat sink of the heat dissipation device, without increasing the size and weigh of the heat sink.

SUMMARY OF THE INVENTION

According to a preferred embodiment of the present invention, a heat dissipation device includes a cooling fan defining an air inlet and an air outlet perpendicular to the air inlet; a metal foam is arranged in the air outlet of the cooling fan, and a heat pipe has one end being thermally attached to the metal foam. The metal foam forms numerous open cells. A plurality of guiding holes are defined in the metal foam facing to a rotor of the cooling fan for an airflow generated by the cooling fan to flow therethrough. Each of the guiding holes has an outer end opened to an outside of the cooling fan. Furthermore, each of the guiding holes has a size larger than that of each of the open cells.

Other advantages and novel features of the present invention will be drawn from the following detailed description of the preferred embodiment of the present invention with attached drawings, in which:

DETAILED DESCRIPTION OF THE INVENTION

Figure 1:
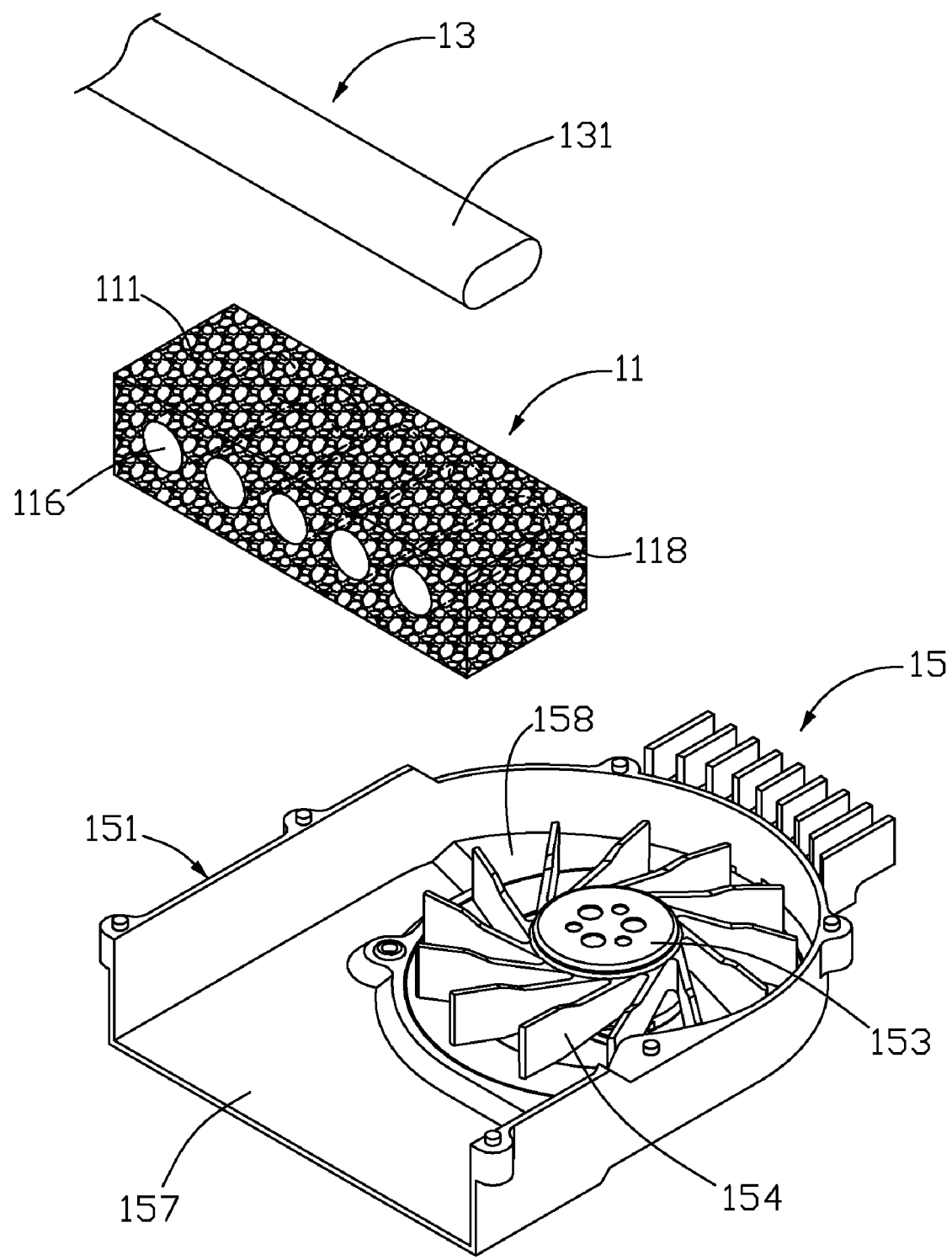
FIG. 1 is an exploded, isometric view of a heat dissipation device in accordance with a preferred embodiment of the present invention.
Figure 2:
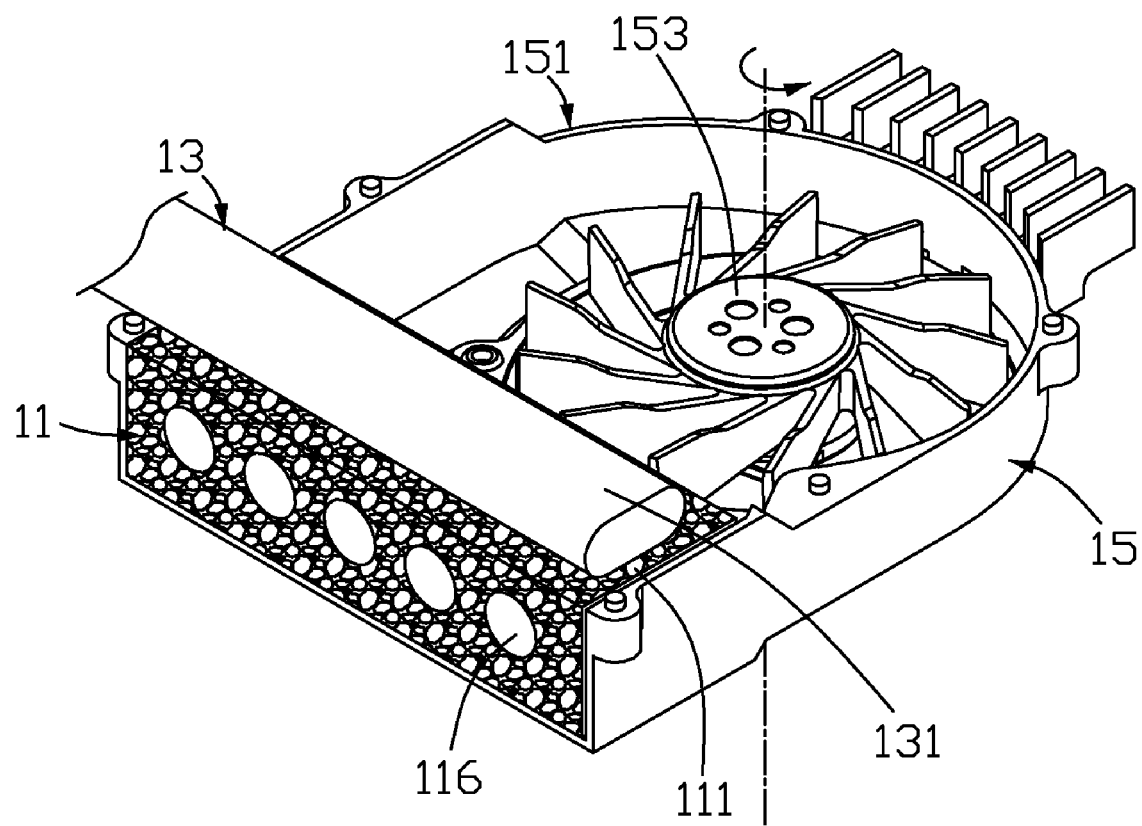
FIG. 2 is an assembled view of the heat dissipation device of FIG. 1.

Referring to FIGS. 1-2, a heat dissipation device according to a preferred embodiment of the present invention includes a cooling fan 15, a heat sink in a form of a metal foam 11, and a heat pipe 13.

The cooling fan 15 is a centrifugal blower, which includes a housing 151, a stator (not shown) mounted in the housing 151 and a rotor 153 being rotatable with respect to the stator. A cover (not shown) covers a top of the housing 151 and defines an air inlet (not shown) of the cooling fan 15 for enabling air to flow into the housing 151. An opening is defined in a side of the housing 151, functioning as an air outlet 157 of the cooling fan 15 for the air flowing out the housing 151. The air outlet 157 is oriented perpendicular to the air inlet. The rotor 153 includes a fan blade set (not labeled) and a shaft (not shown) extending downwardly from the fan blade set. The stator includes a bearing (not shown) ratatably receiving the shaft and thus supporting rotation of the shaft. The fan blade set includes a hub (not labeled), and a plurality of fan blades 154 extending radially and outwardly from the hub. A channel 158 defined between the housing 151 and the fan blades 154 has a width being gradually increased along a rotation direction of the rotor 153 for improving the volumetric flow rate of the airflow. In this embodiment, the rotor 153 rotates along an anticlockwise direction, and thus the width of the channel 158 is maximum at a left side, and is minimum at a right side thereof, as viewed from the drawings.

The heat pipe 13 can be a plate-type heat pipe, a rounded heat pipe, a loop-type heat pipe or a pulsating heat pipe (PHP) made of thermally conductive metal materials such as copper, copper alloy, aluminum, and so on. In this embodiment, the heat pipe 13 is a plate-type heat pipe which has an elongated body with planar-shaped top and bottom outer surfaces. The heat pipe 13 has an evaporating section (not shown) and a condensing section 131 formed at two opposite ends thereof, respectively. A working fluid (not shown) is received in the heat pipe 13 as a heat carrier, which undergoes a phase transition between liquid state and vaporous state when it receives and releases heat. A structure of the heat pipe 13 is well known by those skilled in the art; thus, a detailed explanation thereof is omitted herefrom.

The metal foam 11 for constituting the heat sink is porous. The metal foam 11 has an elongated cuboid shape, and is arranged at the air outlet 157 of the housing 151 of the cooling fan 15. A top side 111 of the metal foam 11 is combined to the condensing section 131 of the heat pipe 13. The metal foam 11 can be made of such materials as stainless steel, copper, copper alloy, aluminum alloy and silver. As exaggeratingly shown, the metal foam 11 has a network of metal ligaments or wires forming numerous open cells 118 to provide porosity. The cells 118 may be randomly distributed throughout the metal foam 11. The metal foam 11 is fabricated by expanding and solidifying a pool of liquid metal saturated with an inert gas under pressure. Density of the porous metal is varied by applying different levels of pressure. The porosity of the foam after solidification may be in a wide range with the open cells 118 randomly distributed over the metal foam 11. Thus the metal foam 11 has a compact structure in combination with a large surface area. The maximum surface area of unit volume of the metal foam 11 can approximately reach to 104 $m^2/m^3$ (surface area of the ligaments/volume of the metal foam 11). Four guiding holes 116 communicating with the cells 118 are defined in the metal foam 11. The four guiding holes 116 extend through the metal foam 111 and thus face to the rotor 153 when the metal foam 11 is mounted in the air outlet 157 of the cooling fan 15. Each guiding hole 116 is circular-shaped and has a diameter much larger than that of the cells 118. The four guiding holes 116 are with the same length, and are evenly spaced from each other. Each guiding hole 116 has an outer end (not labeled) opened to an outside of the cooling fan 15.

During operation of the heat dissipation device, the evaporating section of the heat pipe 13 is thermally connected, directly or indirectly, to a heat-generating electronic device (not shown) to absorb heat therefrom. The condensing section 131 of the heat pipe 13 attaches to the top side 111 of the metal foam 11. The metal foam 11 is received in the air outlet 157 with the guiding holes 116 being arranged facing the rotor 153 and the channel 158. When absorbing the heat generated by the heat-generating electronic device, the working fluid of the heat pipe 13 evaporates into vapor. The vapor moves from the evaporating section to the condensing section 131 to dissipate the heat to the metal foam 11. An airflow generated by the rotor 153 of the cooling fan 15 flows through the channel 158 along the rotation direction of the rotor 153 of the cooling fan 15 to the metal foam 11. As the metal foam 11 has a plurality of open cells 118, the airflow not only flows through the guiding holes 116, but also the cells 118 of the metal foam 11. Thus heat exchange area between the metal foam 11 and the airflow is much increased for the large surface area of the metal foam 11, and the heat of the metal foam 11 can be dissipated to the airflow rapidly. After heat exchanging of the metal foam 11 and the airflow, the airflow with the heat then flows out the metal foam 11 either through the guiding holes 116 or the cells 118 and thus to dissipate the heat to surrounding environment timely. Therefore, the porous metal foam 11 can provide a larger heat dissipation area and can dissipate the heat of the heat generating device to the airflow of the cooling fan 15 rapidly. Furthermore, the guiding holes 116 can guide the heated airflow to the environment quickly, and thus to dissipate the heat to the environment timely. Finally, the heat dissipation efficiency of the heat dissipation device is much improved.

Figure 3:
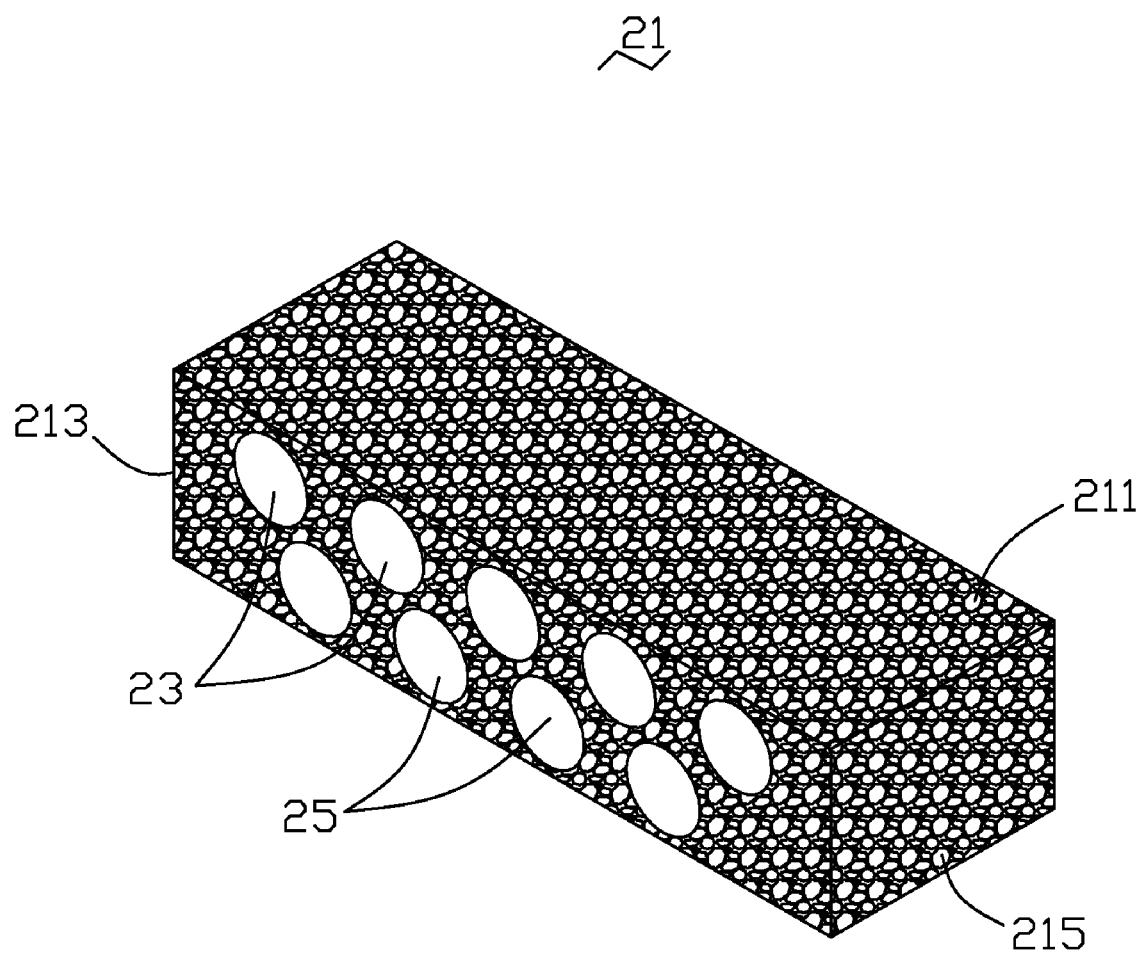
FIG. 3 is an isometric view of a metal foam of the heat dissipation device in accordance with a second embodiment of the present invention.

FIGS. 3-7 each schematically show a metal foam of the heat dissipating device in accordance with an alternative embodiment of the present invention. In FIG. 3, the metal foam 21 defines nine guiding holes therethrough. The nine guiding holes are divided into two arrays 23, 25, including an upper array 23 and a lower array 25 below the upper array 23. The upper array 23 has five guiding holes being arranged adjacent to the top side 211 of the metal foam 21 which is thermally attached to the heat pipe 13. The five guiding holes of the upper array 23 are arranged parallel to and spaced from each other. The lower array 25 has four guiding holes being arranged parallel to and spaced from each other. The two arrays 23, 25 are parallel to each other. Along the latitudinal direction, the guiding holes of the two arrays 23, 25 are alternately arranged. Each guiding hole of the lower array 25 is located between two adjacent guiding holes of the upper array 23. The upper array 23 has two guiding holes being respectively arranged adjacent to two lateral sides (i.e., the left and right sides 213, 215) of the metal foam 21. The other three guiding holes of the upper array 23 are located between the two lateral guiding holes, and each of the other three guiding holes of the upper array 23 is located between two adjacent guiding holes of the lower array 25. Thus the metal foam 21 can provide more passages for the airflow, especially for a portion of the metal foam 21 adjacent to the heat pipe 13, which has a relatively high temperature.

Figure 4:
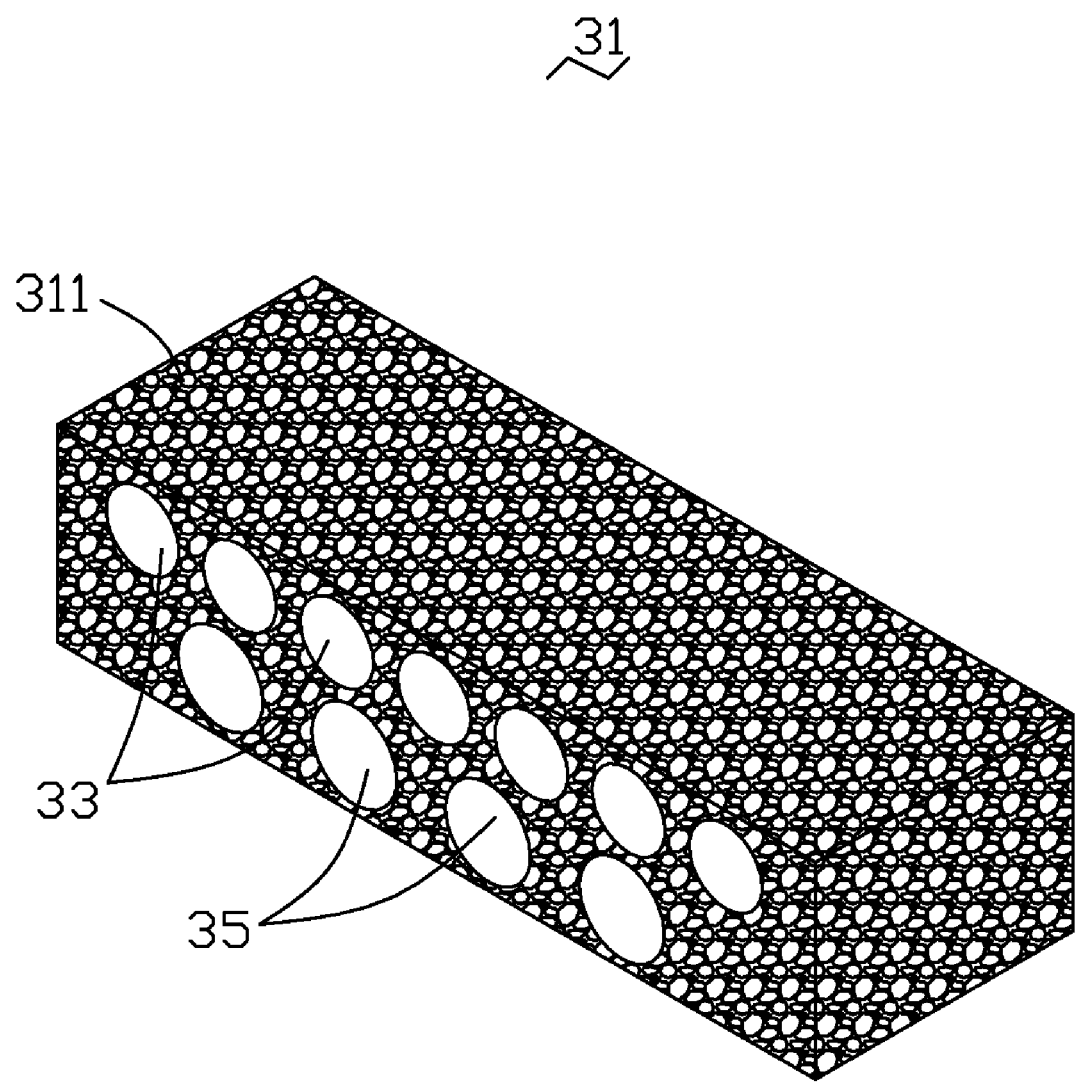
FIG. 4 shows an isometric view of the metal foam in accordance with a third embodiment of the present invention.

FIG. 4 also shows that the metal foam 31 has two arrays 33, 35 of guiding holes as the second embodiment of the metal foam 21 shown in FIG. 3. The difference between this embodiment and the second embodiment is that the guiding holes of the upper array 33 adjacent to the top side 311 of the metal foam 31 each have a diameter smaller than that of the guiding holes of the lower array 35. In this embodiment, the lower array 35 has four guiding holes, whilst the upper array 33 has seven guiding holes.

Figure 5:
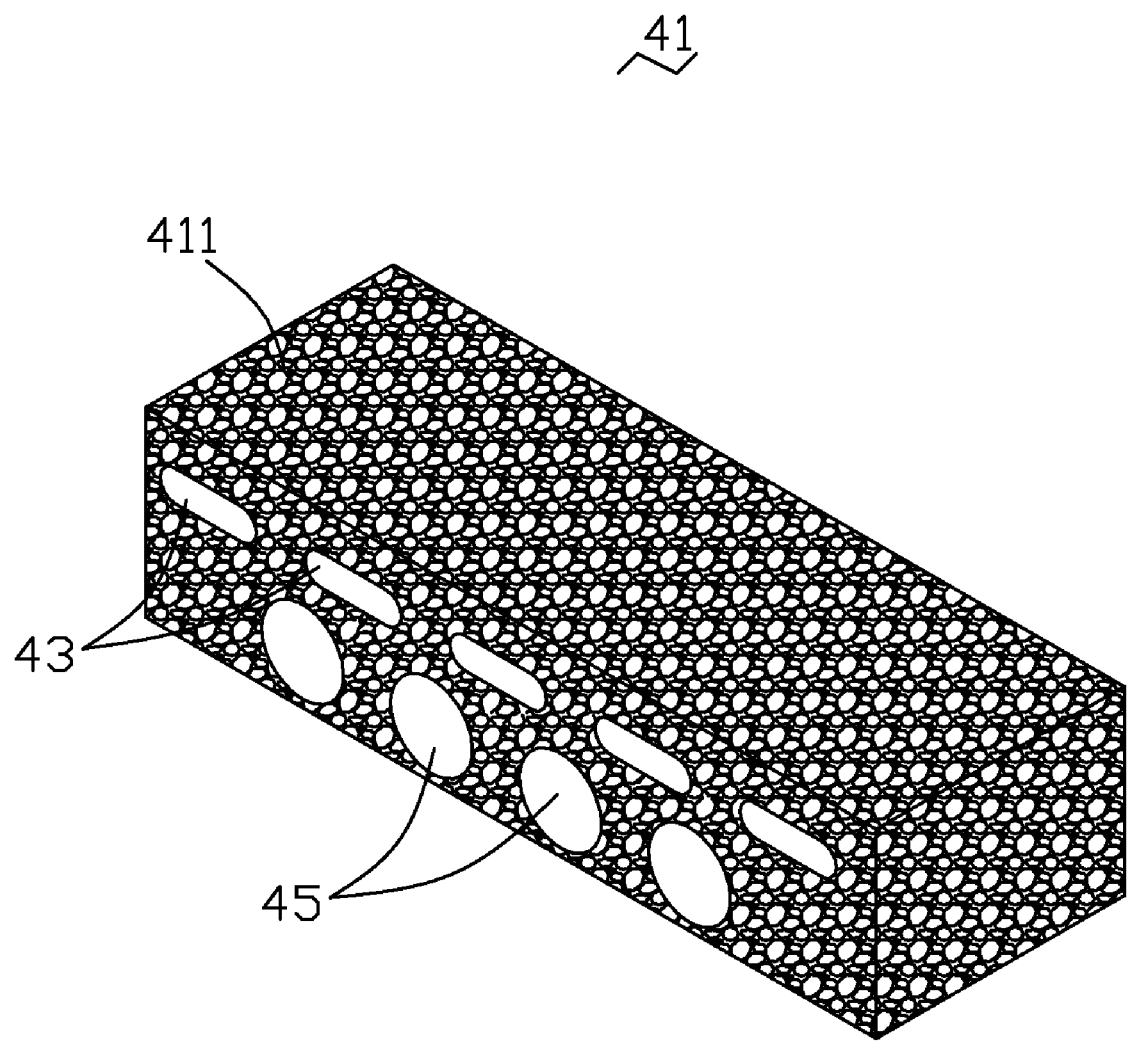
FIG. 5 is an isometric view of the metal foam in accordance with a fourth embodiment of the present invention.

Referring to FIG. 5, a fourth embodiment of the metal foam 41 is shown. Also the metal foam 41 has an upper array 43 and a lower array 45 of guiding holes. The lower array 45 has four circular-shaped guiding holes. The difference between the fourth embodiment and the second embodiment is that the upper array 43 adjacent to the top side 411 has five guiding holes with a different shape. The guiding holes of the upper array 43 each have a flat, rectangular shape with two opposite sides being arc-shaped. It is can be understood that the guiding holes can be other shapes, such as square, triangle, polygon or irregular shape.

Figure 6:
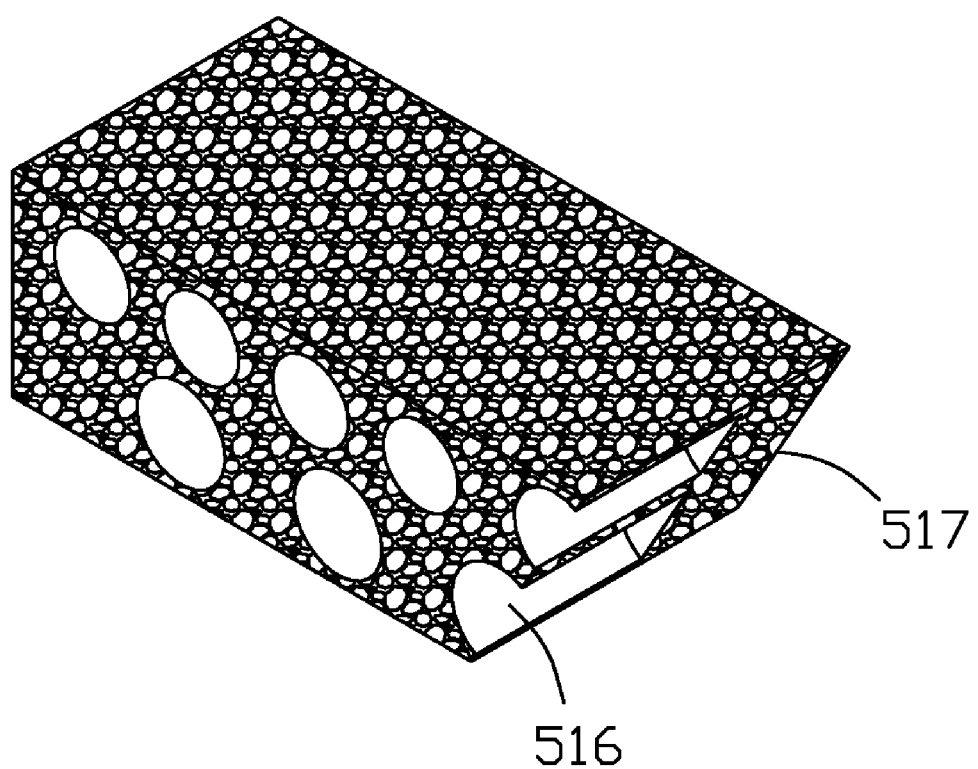
FIG. 6 is an cross-sectional view of the metal foam in accordance with a fifth embodiment of the present invention.

FIG. 6 shows a fifth embodiment of the metal foam 51. As the second embodiment, the metal foam 51 defines two arrays of guiding holes 516 therein. The difference between this embodiment and the second embodiment is that the guiding holes 516 only extend about ⅔ of the length of the metal foam 51, and does not extend through an inner side 517 of the metal foam 51 which is adjacent to the rotor 153 of the cooling fan 15.

Figure 7:
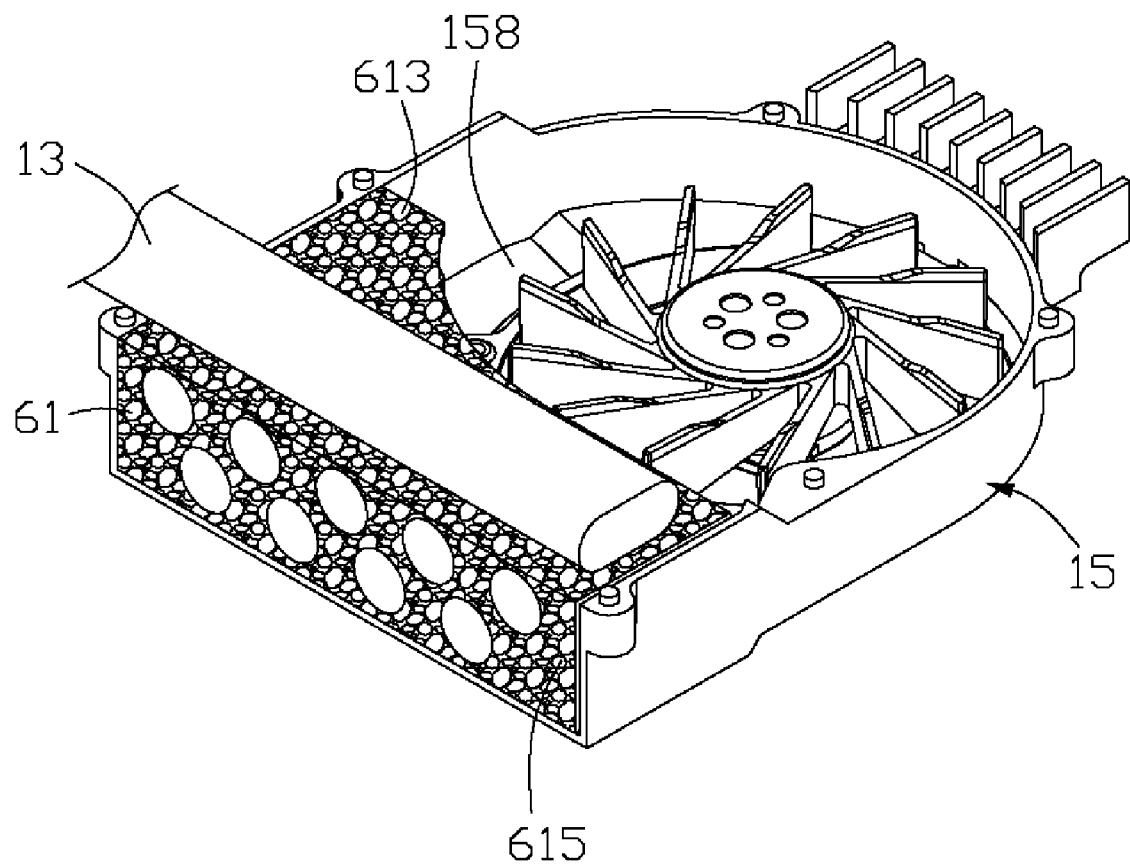
FIG. 7 is an isometric view of the metal foam in accordance with a sixth embodiment of the present invention.

In FIG. 7, a sixth embodiment is shown. In this embodiment, the metal foam 61 has an irregular shape. A left side 613 of the metal foam 61 has a length larger than the right side 615 of the metal foam 61. When the metal foam 61 is arranged in the air outlet 157 of the cooling fan 15, the left side 613 of the metal foam 61 extends into the channel 158 of the cooling fan 15, and thus the airflow can flow into the metal foam 61 more quickly and a heat exchange efficiency of the metal foam 61 can be further improved.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:
1. A heat dissipation device comprising:
   a cooling fan defining an air outlet and having a rotor for generating an airflow when the rotor rotates, the airflow leaving the cooling fan through the air outlet; and
   a metal foam being arranged in the air outlet of the cooling fan, the metal foam forming numerous open cells, and defining at least one guiding hole facing the rotor of the cooling fan, the at least one guiding hole having a size larger than that of anyone of the open cells and having an outer end opened to an outside of the cooling fan.

2. The heat dissipation device of claim 1, wherein the cooling fan is a centrifugal blower having an air inlet, and the air outlet is oriented perpendicular to the air inlet.

3. The heat dissipation device of claim 1, further comprising a heat pipe with one end being thermally attached to the metal foam and another end adapted for thermally attaching to a heat generating device to absorb heat therefrom.

4. The heat dissipation device of claim 1, wherein the at least one guiding hole extends through the metal foam.

5. The heat dissipation device of claim 1, wherein the at least one guiding hole does not extend to a side of the metal foam adjacent to the rotor of the cooling fan.

6. The heat dissipation device of claim 1, wherein the at least one guiding hole has one of the following shapes: circular, square, triangle, polygon and irregular.

7. The heat dissipation device of claim 1, wherein the at least one guiding hole comprises two arrays of guiding holes being arranged along a longitudinal direction of the metal foam, the guiding holes of the two arrays being arranged alternately along a latitudinal direction of the metal foam.

8. The heat dissipation device of claim 7, further comprising a heat pipe thermally attaching to the metal foam, one array of the guiding holes adjacent to the heat pipe having a number larger than that of the other array.

9. The heat dissipation device of claim 7, further comprising a heat pipe thermally attaching to the metal foam, each of the guiding holes of one array of the guiding holes adjacent to the heat pipe having a diameter smaller than that of the other array.

10. The heat dissipation device of claim 7, further comprising a heat pipe thermally attaching to the metal foam, each of the guiding holes of one array of the guiding holes adjacent to the heat pipe having a flat, rectangular shape with two opposite sides thereof being arc-shaped.

11. The heat dissipation device of claim 1, wherein the metal foam has a portion extending from the air outlet into a channel between the rotor and a housing of the cooling fan.

12. A heat dissipation device, comprising:
a blower fan defining an air inlet and an air outlet oriented perpendicular to the air inlet, and having a rotor for generating an airflow when the rotor rotates, the airflow flowing from the air inlet to the air outlet;
a metal foam being arranged in the air outlet of the cooling fan, the metal foam forming numerous open cells, and defining a plurality of guiding holes facing the rotor of the cooling fan for the airflow generated by the blower fan to flow therethrough, the guiding holes each having a size larger than anyone of the open cells and an outer end opened to an outside of the cooling fan; and
a heat pipe having one end being thermally attached to the metal foam.

* * * * *